United States Patent
Chen

(10) Patent No.: US 8,158,965 B2
(45) Date of Patent: Apr. 17, 2012

(54) HEATING CENTER PCRAM STRUCTURE AND METHODS FOR MAKING

(75) Inventor: Shih-Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 335 days.

(21) Appl. No.: 12/026,342

(22) Filed: Feb. 5, 2008

(65) Prior Publication Data

US 2009/0194758 A1 Aug. 6, 2009

(51) Int. Cl.
*H01L 47/00* (2006.01)
(52) U.S. Cl. ............ 257/3; 257/2; 257/4; 257/E29.105; 257/E29.109; 257/E27.002
(58) Field of Classification Search ................ 257/3
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,389,566 A | 2/1995 | Lage |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,751,012 A | 5/1998 | Wolstenholme et al. |
| 5,754,472 A | 5/1998 | Sim et al. |
| 5,789,277 A | 8/1998 | Zahorik et al. |

(Continued)

FOREIGN PATENT DOCUMENTS

CN 1462478 12/2003
(Continued)

OTHER PUBLICATIONS

"Magnetic Bit Boost," www.sciencenews.org, Dec. 18 & 25, 2004, p. 389, vol. 166.

(Continued)

*Primary Examiner* — Jerome Jackson, Jr.
(74) *Attorney, Agent, or Firm* — Haynes Beffel & Wolfeld LLP

(57) ABSTRACT

Memory devices are described along with manufacturing methods. A memory device as described herein includes a bottom electrode and a first phase change layer comprising a first phase change material on the bottom electrode. A resistive heater comprising a heater material is on the first phase change material. A second phase change layer comprising a second phase change material is on the resistive heater, and a top electrode is on the second phase change layer. The heater material has a resistivity greater than the most highly resistive states of the first and second phase change materials.

18 Claims, 11 Drawing Sheets

U.S. PATENT DOCUMENTS

| | | | |
|---|---|---|---|
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,507,061 B1 | 1/2003 | Hudgens et al. | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,858 B1 | 4/2003 | Jones et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,625,054 B2 | 9/2003 | Lowrey et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,696,355 B2 | 2/2004 | Dennison | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,764,894 B2 | 7/2004 | Lowrey | |
| 6,791,102 B2 | 9/2004 | Johnson et al. | |
| 6,797,979 B2 | 9/2004 | Chiang et al. | |
| 6,805,563 B2 | 10/2004 | Ohashi et al. | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,897,467 B2 | 5/2005 | Doan et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,009,694 B2 | 3/2006 | Hart et al. | |
| 7,018,911 B2 | 3/2006 | Lee et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,231 B2 | 5/2006 | Hart et al. | |
| 7,038,938 B2 | 5/2006 | Kang et al. | |
| 7,042,001 B2 | 5/2006 | Kim et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,082,051 B2 | 7/2006 | Ha et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,149,103 B2 | 12/2006 | Ahn | |
| 7,154,774 B2 | 12/2006 | Bedeschi et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,170,777 B2 | 1/2007 | Choi et al. | |
| 7,202,493 B2 | 4/2007 | Lung et al. | |
| 7,208,751 B2 | 4/2007 | Ooishi et al. | |
| 7,214,958 B2 | 5/2007 | Happ | |
| 7,220,983 B2 | 5/2007 | Lung | |
| 7,233,017 B2 | 6/2007 | Yoon et al. | |
| 7,238,994 B2 | 7/2007 | Chen et al. | |
| 7,242,019 B2 | 7/2007 | Wicker | |
| 7,248,494 B2 | 7/2007 | Oh et al. | |
| 7,251,157 B2 | 7/2007 | Osada et al. | |

| Patent/Publication | Date | Inventor |
|---|---|---|
| 7,259,040 B2 | 8/2007 | Pellizzer et al. |
| 7,269,052 B2 | 9/2007 | Segal et al. |
| 7,274,586 B2 | 9/2007 | Choi et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,394,089 B2 | 7/2008 | Doyle et al. |
| 7,397,060 B2 | 7/2008 | Lung |
| 7,422,926 B2 | 9/2008 | Pellizzer et al. |
| 7,423,300 B2 | 9/2008 | Lung et al. |
| 7,426,134 B2 | 9/2008 | Happ et al. |
| 7,436,692 B2 | 10/2008 | Pellizzer et al. |
| 7,485,891 B2 | 2/2009 | Hamann et al. |
| 7,504,653 B2 | 3/2009 | Lung |
| 7,531,378 B2 * | 5/2009 | Peters .............................. 438/95 |
| 7,579,613 B2 | 8/2009 | Lung et al. |
| 7,606,059 B2 | 10/2009 | Toda |
| 7,623,370 B2 | 11/2009 | Toda et al. |
| 7,778,063 B2 | 8/2010 | Brubaker et al. |
| 7,868,313 B2 | 1/2011 | Breitwisch et al. |
| 2002/0042158 A1 | 4/2002 | Kersch et al. |
| 2002/0070457 A1 | 6/2002 | Sun et al. |
| 2002/0113273 A1 | 8/2002 | Hwang et al. |
| 2003/0003647 A1 | 1/2003 | Dennison et al. |
| 2003/0021966 A1 | 1/2003 | Segal et al. |
| 2003/0036232 A1 | 2/2003 | Dennison |
| 2003/0095426 A1 | 5/2003 | Hush et al. |
| 2003/0186481 A1 | 10/2003 | Lung |
| 2003/0215978 A1 | 11/2003 | Maimon et al. |
| 2004/0026686 A1 | 2/2004 | Lung |
| 2004/0051094 A1 | 3/2004 | Ooishi |
| 2004/0114317 A1 | 6/2004 | Chiang et al. |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0019975 A1 | 1/2005 | Lee et al. |
| 2005/0024338 A1 | 2/2005 | Ye |
| 2005/0029502 A1 | 2/2005 | Hudgens |
| 2005/0030800 A1 | 2/2005 | Johnson et al. |
| 2005/0036364 A1 | 2/2005 | Ha et al. |
| 2005/0062087 A1 | 3/2005 | Chen et al. |
| 2005/0064606 A1 | 3/2005 | Pellizzer et al. |
| 2005/0093022 A1 | 5/2005 | Lung |
| 2005/0127347 A1 | 6/2005 | Choi et al. |
| 2005/0141261 A1 | 6/2005 | Ahn |
| 2005/0145984 A1 | 7/2005 | Chen et al. |
| 2005/0152208 A1 | 7/2005 | Bez et al. |
| 2005/0184282 A1 | 8/2005 | Lai et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0215009 A1 | 9/2005 | Cho |
| 2005/0265072 A1 | 12/2005 | Hart et al. |
| 2006/0001174 A1 | 1/2006 | Matsui |
| 2006/0003263 A1 | 1/2006 | Chang |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0071204 A1 * | 4/2006 | Happ ............................... 257/3 |
| 2006/0073642 A1 | 4/2006 | Yeh et al. |
| 2006/0073652 A1 | 4/2006 | Pellizzer et al. |
| 2006/0077741 A1 | 4/2006 | Wang et al. |
| 2006/0091374 A1 | 5/2006 | Yoon et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0145134 A1 | 7/2006 | Hart et al. |
| 2006/0154185 A1 | 7/2006 | Ho et al. |
| 2006/0157681 A1 | 7/2006 | Chen et al. |
| 2006/0158928 A1 | 7/2006 | Pellizzer et al. |
| 2006/0163553 A1 | 7/2006 | Liang |
| 2006/0169968 A1 | 8/2006 | Happ |
| 2006/0176724 A1 | 8/2006 | Asano et al. |
| 2006/0181931 A1 | 8/2006 | Ha et al. |
| 2006/0215435 A1 | 9/2006 | Jeong et al. |
| 2006/0226409 A1 | 10/2006 | Burr et al. |
| 2006/0234138 A1 | 10/2006 | Fehlhaber et al. |
| 2006/0249369 A1 | 11/2006 | Marangon et al. |
| 2006/0249725 A1 | 11/2006 | Lee |
| 2006/0278900 A1 | 12/2006 | Chang et al. |
| 2006/0279978 A1 | 12/2006 | Krusin-Elbaum et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0020797 A1 | 1/2007 | Pellizzer et al. |
| 2007/0030721 A1 | 2/2007 | Segal et al. |
| 2007/0037101 A1 | 2/2007 | Morioka |
| 2007/0045605 A1 | 3/2007 | Hsueh |
| 2007/0045606 A1 | 3/2007 | Magistretti et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |

| | | | |
|---|---|---|---|
| 2008/0012000 | A1 | 1/2008 | Harshfield |
| 2008/0014676 | A1 | 1/2008 | Lung et al. |
| 2008/0025089 | A1 | 1/2008 | Scheuerlein et al. |
| 2008/0043520 | A1 | 2/2008 | Chen |
| 2008/0094871 | A1 | 4/2008 | Parkinson |
| 2008/0101110 | A1 | 5/2008 | Happ et al. |
| 2008/0116441 | A1 | 5/2008 | Raghuram et al. |
| 2008/0137400 | A1 | 6/2008 | Chen et al. |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0224119 | A1 | 9/2008 | Burr et al. |
| 2008/0225489 | A1 | 9/2008 | Cai et al. |
| 2009/0148980 | A1 | 6/2009 | Yu |
| 2009/0298223 | A1 | 12/2009 | Cheek et al. |
| 2010/0193763 | A1 | 8/2010 | Chen et al. |
| 2010/0291747 | A1 | 11/2010 | Lung et al. |
| 2011/0034003 | A1 | 2/2011 | Lung |

FOREIGN PATENT DOCUMENTS

| | | |
|---|---|---|
| TW | 0552681 B | 9/2003 |
| WO | WO-0079539 | 12/2000 |
| WO | WO-0145108 | 6/2001 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, System and Applications, Apr. 23-25, 2007, pp. 1-2.
Axon Technologies Corporation paper: Technology Description, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge—Sn—Sb—Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM—A 180 nm Nonvolatile Memory Cell Element Technology for Stand Alone and Embedded Applications, IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

HEATING CENTER PCRAM STRUCTURE AND METHODS FOR MAKING

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process and allowing at least a portion of the phase change material to stabilize in the amorphous state. It is desirable to minimize the magnitude of the reset current used to cause the transition of the phase change material from the crystalline state to the amorphous state. The memory cells using phase change material include an "active region" in the bulk of the phase change material of the cell in which the actual phase transitions are located. Techniques are applied to make the active region small, so that the amount of current needed to induce the phase change is reduced. Also, techniques are used to thermally isolate the active region in the phase change cell so that the resistive heating needed to induce the phase change is confined to the active region.

The magnitude of the current needed to induce a phase change during reset can be reduced by increasing the resistivity of the phase change material because the phase change occurs as a result of heating and the temperature increase due to self-heating is proportional to the resistivity of the phase change material (ignoring heat sink effects). However, a small read current will also be needed to insure that the phase change material does not undergo an undesired phase change during the reading of data from the memory cell. Issues associated with a small read current include a slow read process. Additionally, increasing the resistivity of the phase change material will result in a higher overall resistance for the memory cell and does not have provide any benefit for power consumption of the memory cell. Furthermore, it has been observed that a higher overall memory cell resistance may result in a lower SET speed.

The magnitude of the current needed for reset can also be reduced by reducing the size of the phase change material element in the cell and/or the contact area between electrodes and the phase change material, such that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Another technology developed by the assignee of the present application is referred to as a phase change bridge cell, in which a very small patch of memory material is formed as a bridge across a thin film insulating member located between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., incorporated by reference as if fully set forth herein, which application was owned at the time of invention and is currently owned by the same assignee.

Yet another approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell using gaps or voids on the sides of the phase change material. It has also been proposed to use thermally insulating materials to improve the confinement of heat to the active region.

Also, approaches to improving thermal isolation include forming the phase change element in a way that tends to isolate the active region from the electrodes, as shown for example in U.S. patent application Ser. No. 11/348,848, filed 7 Feb. 2006, entitled "I-Shaped Phase Change Memory Cell" by Chen et al., incorporated by reference as if fully set forth herein, which application was owned at the time of invention and is currently owned by the same assignee.

Problems have arisen in manufacturing devices with very small dimensions, and with variations in process that meet tight specifications needed for large-scale memory devices. It is therefore desirable to provide a memory cell structure having small dimensions and low reset currents, as well as a structure that addresses the heat flow problem, and methods for manufacturing such structure that meets tight process variation specifications needed for large-scale memory devices. Furthermore, it is desirable to produce memory devices having a small active phase change region.

SUMMARY OF THE INVENTION

A memory device as described herein includes a bottom electrode and a first phase change layer comprising a first phase change material on the bottom electrode. A resistive heater comprising a heater material is on the first phase change material. A second phase change layer comprising a second phase change material is on the resistive heater, and a top electrode is on the second phase change layer. The heater material has a resistivity greater than the most highly resistive states of the first and second phase change materials.

In embodiments illustrated, a memory cell includes a dielectric layer having a top surface and a via extending from the top surface of the dielectric layer. The bottom electrode is within a bottom portion of the via and the first phase change layer is within the top portion of the via.

A method for manufacturing a memory device as described herein includes providing a bottom electrode extending to a top surface of a dielectric layer, and removing a portion of the bottom electrode to form a recess. The method includes filling the recess with a first phase change material layer, and forming a layer of heater material on the first phase change layer. A second phase change layer is formed on the layer of heater material, and a top electrode material layer on the second phase change layer.

A memory cell as described herein results in an active region that can be made very small and provides some thermal isolation from the top and bottom electrodes, thereby reducing the amount of current needed to induce a phase change. The first phase change layer has a width less than the width of the second phase change layer, the width of the first phase change layer preferably less than a minimum feature size for a process, typically a lithographic process, used to form the memory cell. The difference in widths concentrates current in the first phase change layer, thereby reducing the magnitude of current needed to induce a phase change in the active region of the memory cell. Additionally, the heater material has a resistivity greater than that of the phase change materials of the first and second phase change layers, thus raising the temperature of the portions of the first and second phase change layers adjacent the heater layer relative to the other portions of the first and second phase change layers. This can result in the active region being spaced away from the top and bottom electrodes, which allows the remaining portions of the first and second phase change layers to provide some thermal isolation to the active region, which also helps to reduce the amount of current necessary to induce a phase change.

Other aspects and advantages of the invention are described below with reference to the figures.

DETAILED DESCRIPTION

Figure 1:
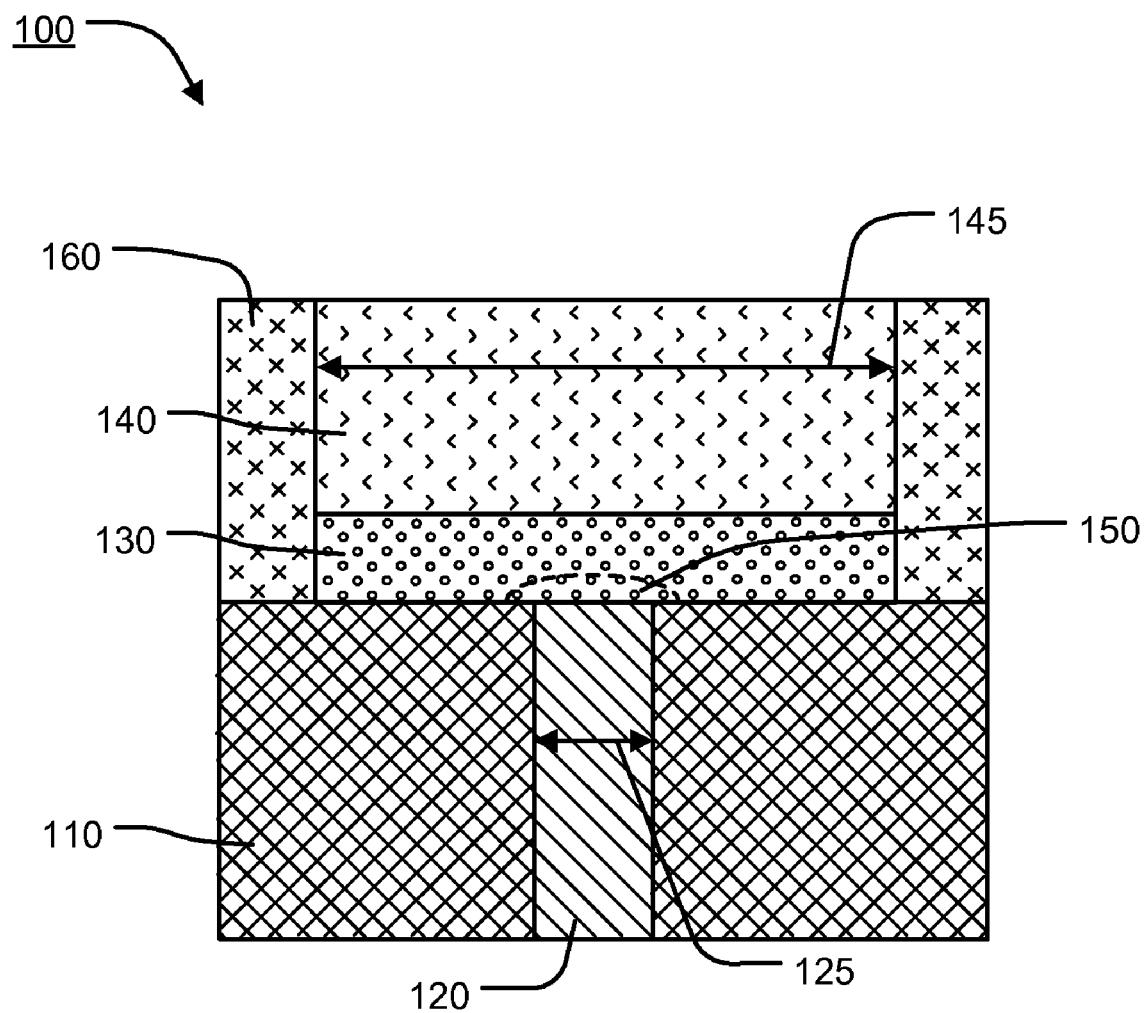
FIG. 1 illustrates a cross-sectional view of a "mushroom" phase change memory cell.

The following description of the invention will typically be with reference to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

A detailed description is provided with reference to FIGS. 1-10.

FIG. 1 illustrates a cross-sectional view of a prior art "mushroom" memory cell having a bottom electrode 120 extending through a dielectric layer 110, a layer of phase change material 130 on the bottom electrode 120, and a top electrode 140 on the phase change material 130. A dielectric layer 160 surrounds the layer of phase change material 130. As can be seen in FIG. 1, the bottom electrode 120 has a width 125 less than the width 145 of the top electrode 140 and phase change material 130. Due to the differences in the widths 125 and 145, in operation the current density will be largest in the region of the phase change layer 130 adjacent the bottom electrode 120, resulting in the active region 150 of the phase change material having a "mushroom" shape as shown in FIG. 1.

Because the phase change in the active region 150 occurs as a result of heating, the thermal conductivity of the bottom electrode 120 will act to draw heat away from the active region 150, thus resulting in a need for higher current to induce the desired phase change in the active region 150.

Figure 2:
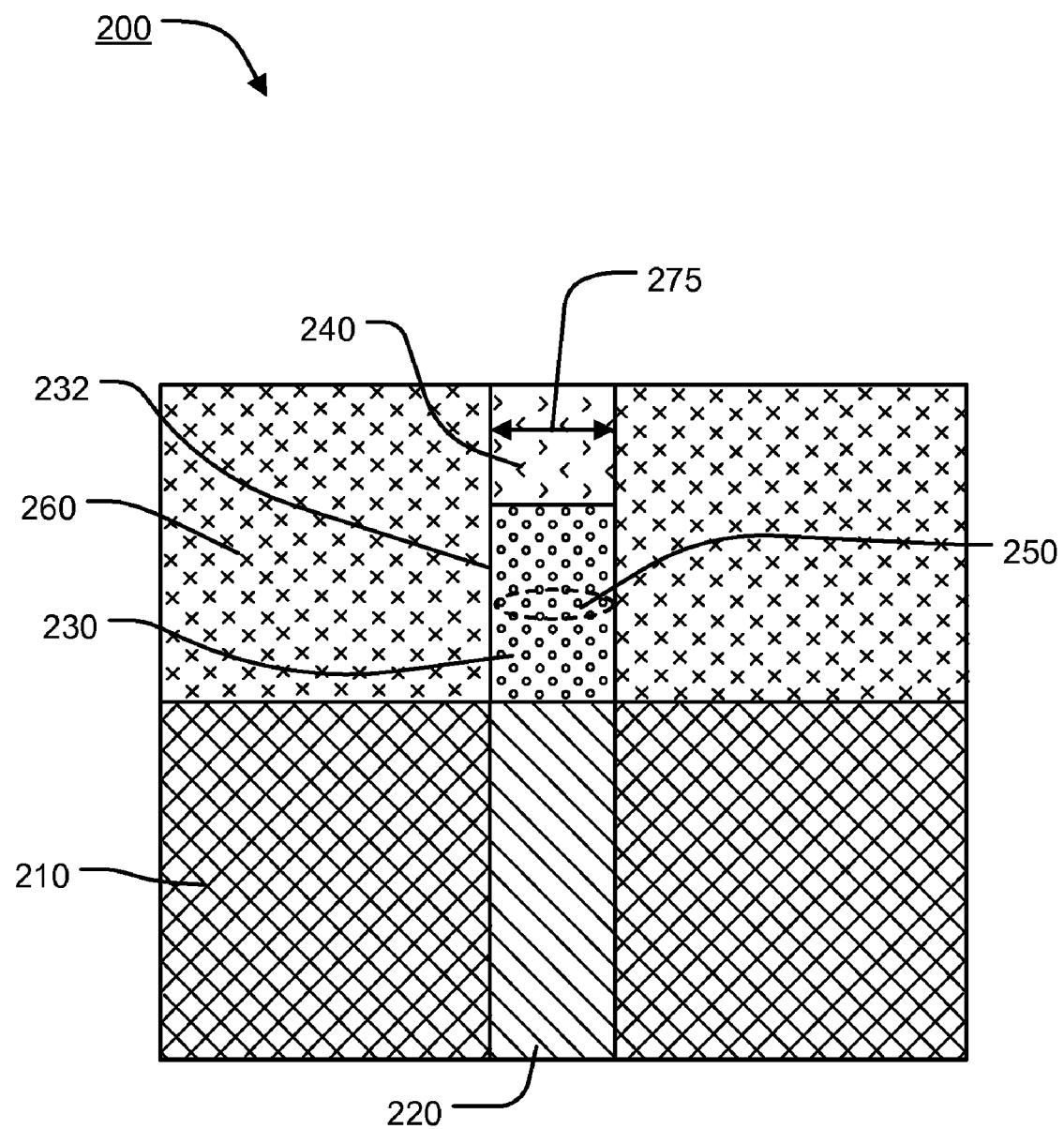
FIG. 2 illustrates a cross-sectional view of a "pillar-type" phase change memory cell.

FIG. 2 illustrates a cross-sectional view of a prior art "pillar-type" memory cell 200. The memory cell 200 includes a bottom electrode 220 in a dielectric layer 210, a pillar of phase change material 230 on the bottom electrode 220, and a top electrode 240 on the pillar of phase change material 230. A dielectric layer 260 surrounds the pillar of phase change material 230. As can be seen in the Figure the top and bottom electrodes 240, 220 have the same width 275 as that of the pillar of phase change material 230. Thus, the active region 250 can be spaced away from the top and bottom electrodes 240, 220, resulting in a reduced heat sink effect by the top and bottom electrodes 240, 220. However, there is heat loss through the sidewalls 232 of the phase change material 230 to the dielectric layer 260 due to the proximity of the active region 250 to the dielectric layer 260.

Additionally, the pillar of phase change material 230 may be formed by depositing a phase change material layer on the bottom electrode 220 and dielectric 210 and subsequently etching the phase change material layer to form the pillar 230. Problems have arisen in manufacturing such devices due to etch damage to the sidewalls 232 of the pillar of memory material 230 and alignment tolerance issues between the pillar of memory material 230 and the bottom electrode 220.

Figure 3:
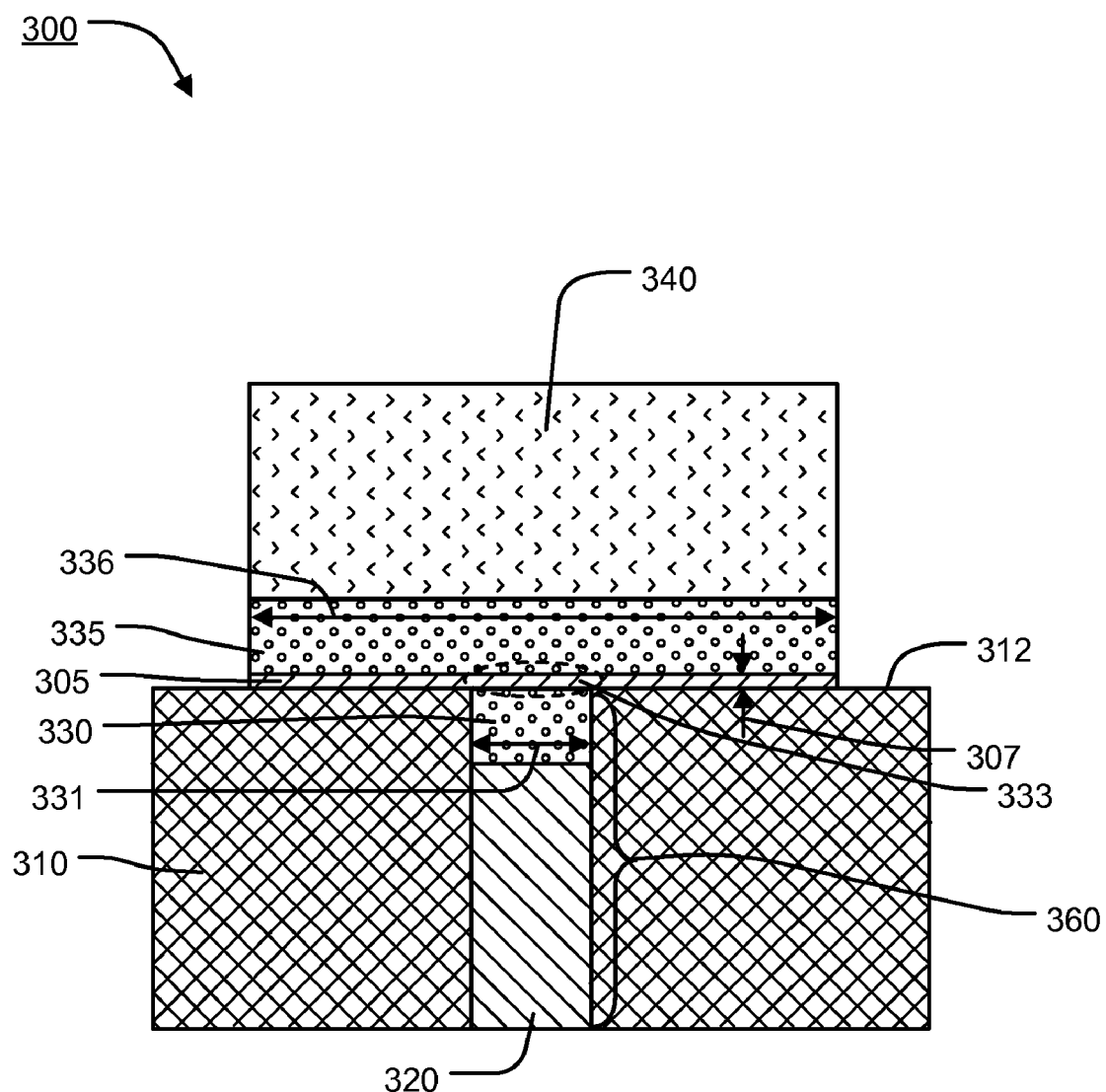
FIG. 3 illustrates a cross-sectional view of a memory cell in accordance with an embodiment.

FIG. 3 illustrates a cross-sectional view of a memory cell 300 in accordance with an embodiment, the memory cell having a resistive heater layer 305 between first and second phase change layers 330, 335. The resistive heater layer 305 comprises heater material having a resistivity greater than the most highly resistive state of the phase change materials of the first and second phase change layers 330, 335.

A via 360 extends from a top surface 312 of the dielectric 310, and the first phase change layer 330 is within a top portion of the via 360 and a bottom electrode 320 is within a bottom portion of the via 360.

The bottom electrode 320 contacts the first phase change layer 330 and extends through the dielectric 310 to underlying access circuitry. The bottom electrode 320 may comprise, for example, TiN or TaN. TiN may be preferred in embodiments in which the phase change layer comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode 320 may be TiAlN or TaAlN, or comprises, for further examples, one or more elements selected from the group consisting of Ti, W, Mo, Al, Ta, Cu, Pt, Ir, La, Ni, N, O and Ru and combinations thereof.

A top electrode 340 is on the second phase change layer 335 and may comprise, for example, any of the materials described above with reference to the bottom electrode 320.

In operation, voltages on the top electrode 340 and bottom electrode 320 can induce current to flow from the bottom electrode 320 to the top electrode 340, or vice versa, via the first phase change layer 330, the heater layer 305, and the second phase change layer 335.

The active region 333 is the region of the memory cell 300 in which memory material is induced to change between at least two solid phases. As can be appreciated the active region 333 can be made extremely small in the illustrated structure, thus reducing the magnitude of current needed to induce a phase change. The first phase change layer 330 has a width 331 less than the width 336 of the second phase change layer 335, the width 331 preferably less than a minimum feature size for a process, typically a lithographic process, used to form the memory cell 300. The difference in the widths 331, 336 concentrates current density in the first phase change layer 330, thereby reducing the magnitude of current needed to induce a phase change in the active region 333. Additionally, the heater material of the heater layer 305 has a resistivity greater than that of the phase change materials of the first and second phase change layers 330, 335, thus raising the temperature of the portions of the first and second phase change layers 330, 335 adjacent the heater layer 305 relative to the other portions of the first and second phase change layers 330, 335. As can be seen in the Figure, the active region 333 is spaced away from both the top and bottom electrodes 340, 320, which allows the remaining portions of the first and second phase change layers 330, 335 to provide some thermal isolation to the active region 330, which also helps to reduce the amount of current necessary to induce a phase change.

The resistance of the heater layer 305 is proportional to the thickness 307 and to the resistivity of the heater material. Increasing the resistance of the heater layer 305 will increase the overall resistance of the memory cell 300, which does not provide any benefits for power consumption of the memory cell 300 and can result in a slower read process of the memory cell 300. However, as explained in more detail below, during operation the increase in temperature in the heater layer 305 is proportional to the resistivity of the heater material. Thus increasing the resistivity of the heater material is desirable since this can reduce the magnitude of the current needed to induce a phase change in the active region 333. Therefore, the thickness 307 of the heater layer 305 is preferably very thin while the resistivity of the heater material is high.

Ignoring heat sink effects, the change in temperature of a self-heated element due to a current I can be given by:

$$\Delta T = \frac{I^2 \cdot R \cdot t}{M \cdot s} \quad (1)$$

where M is the mass of the element, s is the specific heat content of the material, T is temperature, I is the electrical current, R is the electrical resistance, and t is time. Furthermore, the mass M, current I, and resistance R can be represented respectively by:

$$M = A \cdot h \cdot D \quad (2)$$

$$I = J \cdot A \quad (3)$$

$$R = \frac{\rho \cdot h}{A} \quad (4)$$

where A is the cross-sectional area of the current flow in the element, h is the height of the element, D is the density of the material, J is the current density, and ρ is the resistivity of the material. Combining equations (2) to (4) into equation (1) results in:

$$\Delta T = \frac{J^2 \cdot \rho \cdot t}{s \cdot d} \quad (5)$$

Therefore, as can be seen in equation (5) above the change in temperature is proportional to the resistivity of the material.

In one embodiment the resistivity of the heater material is between about 1.5 and 100 times greater than the most highly resistive states of the phase change materials of the first and second phase change layers 330, 335, and in another example is between about 4 and 50 times greater.

Additionally, the thickness 307 of the resistive heater layer 305 is preferably less than that of the first phase change layer 330. In some embodiments the thickness 307 is less than or equal to 10 nm, for example being between about 1 nm and 5 nm.

The resistive heater layer 305 is doped with impurities in some embodiments to modify resistivity, and may comprise, for example, highly doped TiN, TaN, TiW, TiSiN, or TaSiN. Impurities used in doping to increase the resistivity may include, for example, nitrogen, carbon, or silicon. In embodiments in which the resistive heater layer 305 is formed by a plasma vapor deposition PVD process, increased doping may be accomplished, for example, by using a high doped target and/or increasing the N2 flow. In a chemical vapor deposition CVD or atomic vapor deposition ALD process, the increased doping may be achieved, for example, by increasing the N2 flow and/or reducing the operation temperature of these processes.

In one embodiment the resistive heater layer 305 is formed by depositing TiN using a TDMAT (Ti[N(CH$_3$)$_2$]$_4$) precursor, resulting in a significant amount of impurities (mainly Carbon) and causing a high resistivity. An H$_2$ plasma treatment can be used to remove the carbon and reduce the resistivity.

Embodiments of the memory cell 300 include phase change based memory materials, including chalcogenide based materials and other materials, for the first and second phase change layers 330, 335. The first and second phase change layers 530, 535 may comprise the same or different phase change materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon oxygen, silicon dioxide, silicon nitride, copper, silver, gold, aluminum, aluminum oxide, tantalum, tantalum oxide, tantalum oxide, tantalum nitride, titanium and titanium oxide. See, for example U.S. Pat. No. 6,800,504, and U.S. Patent Application Publication No. US 2005/0029502.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N-, Si-, Ti-, or other element doping may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundred volts is also used. Also, the combination of DC bias and the collimator can be used simultaneously. The post deposition annealing treatment with vacuum or N2 ambient is sometimes needed to improve the crystallize state of chalcogenide material. The annealing temperature typically ranges 100° C. to 400° C. with an anneal time of less than 30 minutes.

As was described above, the heater material of the heater layer 305 has a resistivity greater than that of the phase change materials of the first and second phase change layers 330, 335, thus raising the temperature of the portions of the first and second phase change layers 330, 335 adjacent the heater layer 305 relative to the other portions of the first and second phase change layers 330, 335 and reducing the heat sink effect due to the top and bottom electrodes 340, 320.

Figure 4A:
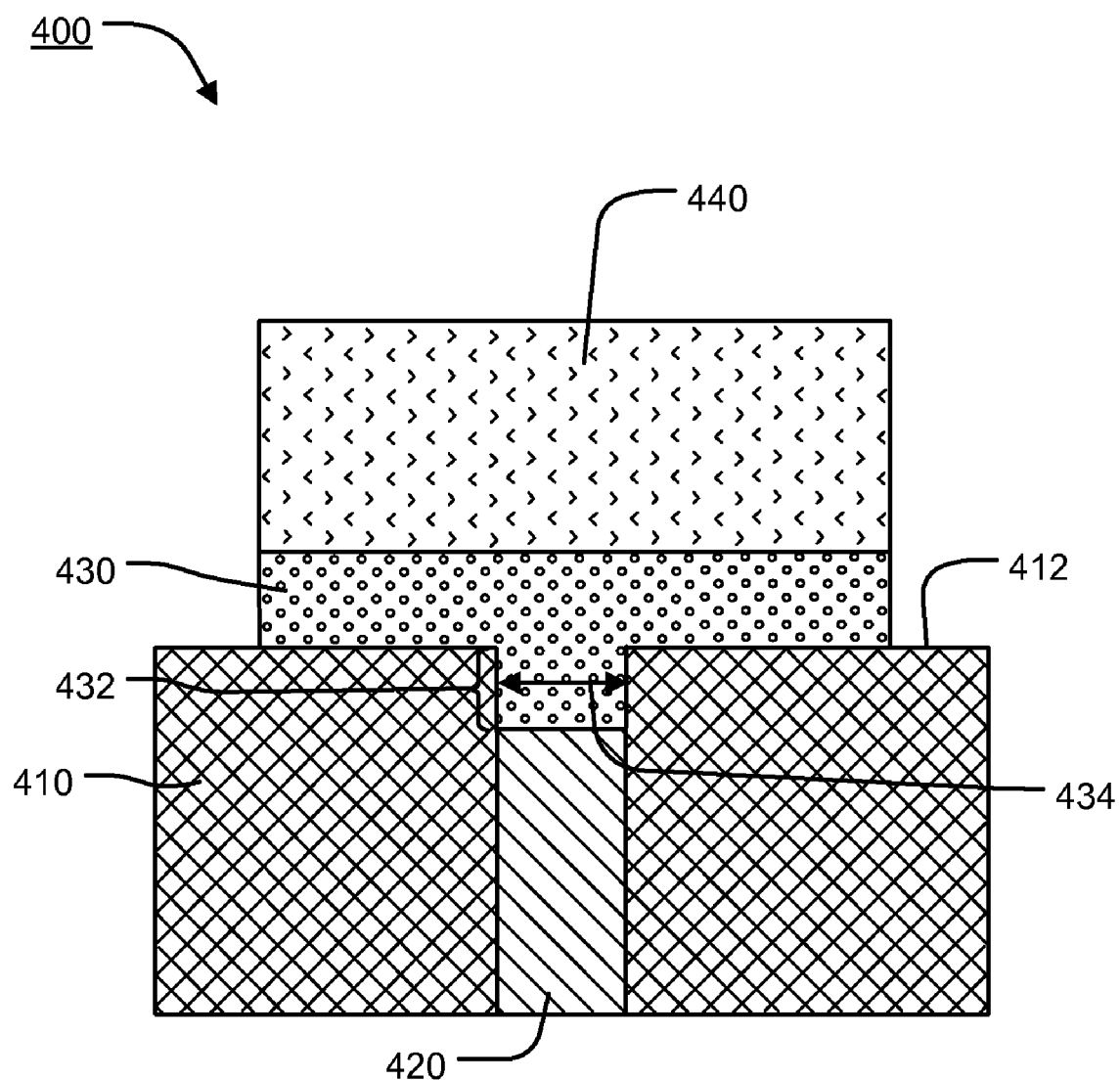
FIG. 4A illustrates a cross-sectional view of a memory cell similar to that of FIG. 3 with the heater layer omitted.
Figure 4B:
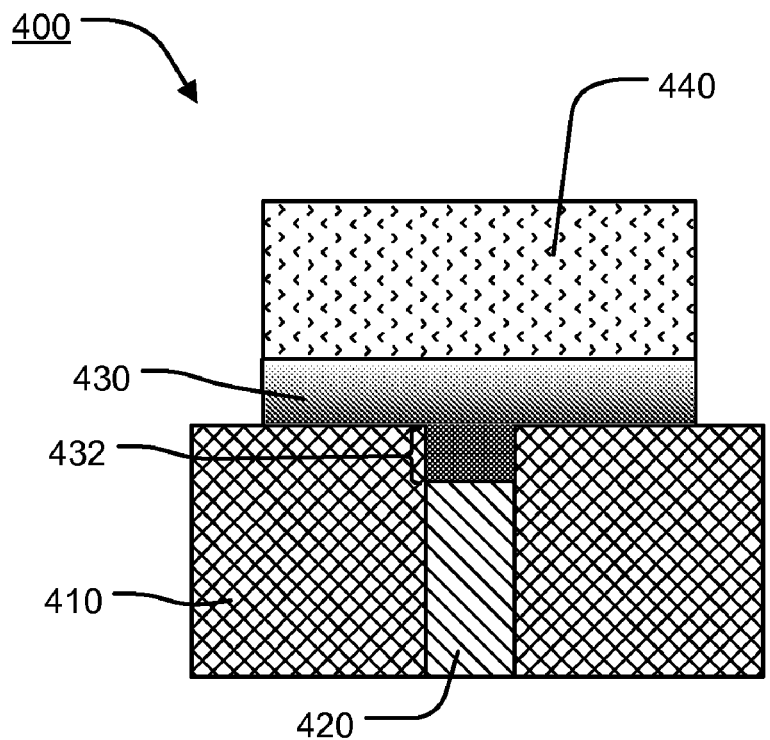
FIG. 4B illustrates the heat generated in the phase change layer of the memory cell illustrated in FIG. 4A during operation.
Figure 4C:
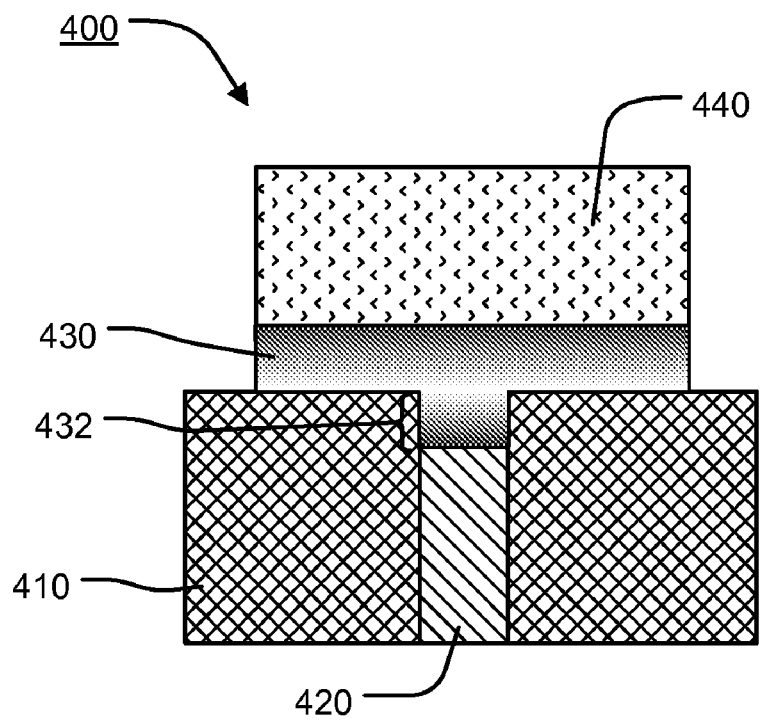
FIG. 4C illustrates the heat loss in the phase change layer of the memory cell illustrated in FIG. 4A during operation.

FIG. 4A illustrates a cross-sectional view of a memory cell 400 similar to that illustrated in FIG. 3 with the heater layer 305 omitted. Without the heater layer 305, the large current density in the region 432 of the phase change material 430 below the top surface 412 of the dielectric 410 will result in significant heat generated adjacent to the bottom electrode 420, as shown in FIG. 4B with the darker colors indicating higher heat generation. Due to the high thermal conductivity of the bottom electrode 420 there will also be a significant amount of heat loss within the region 432 as shown in FIG. 4C, with the darker colors indicating higher heat loss. The high heat loss within the region 432 results in a need for higher current to induce the desired phase change during operation of the memory cell 400.

FIGS. 5-8 illustrate steps in a fabrication sequence in accordance with an embodiment for manufacturing memory cells as described herein. The following description does not repeat certain explanations regarding materials, thicknesses, and the like, as set out above.

Figure 5:
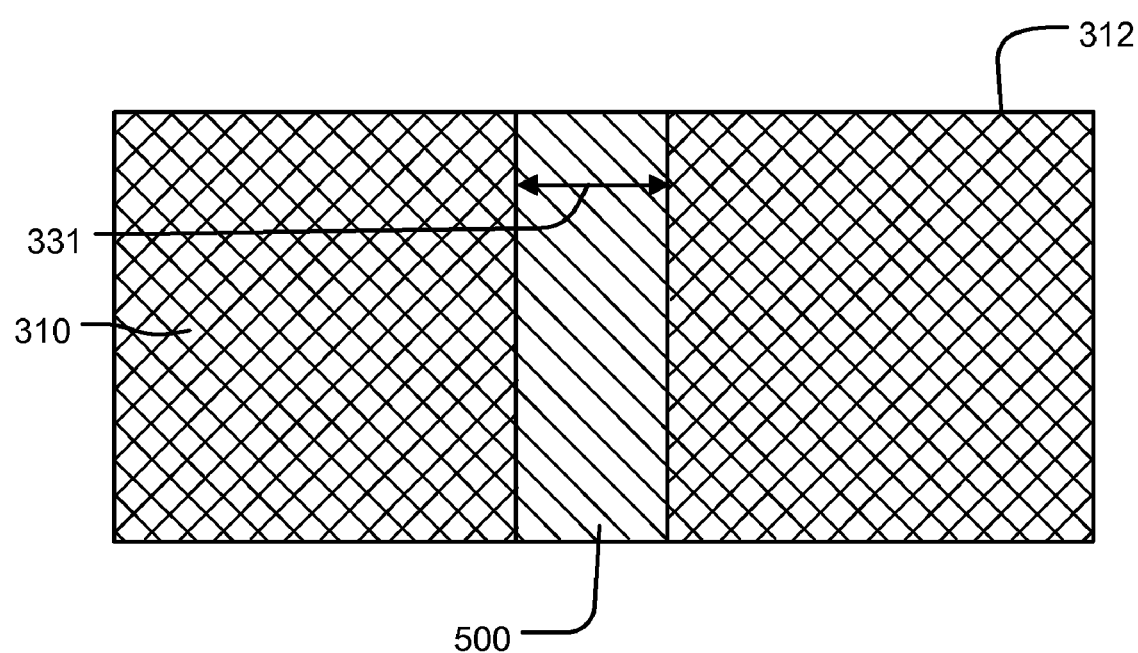
FIGS. 5-8 illustrate an embodiment of a process flow for manufacturing memory cells described herein.

FIG. 5 illustrates a cross-sectional view of a structure formed as a first stage of the fabrication sequence, the structure including a bottom electrode 500 extending from the top surface 312 of dielectric layer 310 to couple to access circuitry (not shown) such as access transistors or diodes and word lines, etc. The bottom electrode 500 has a diameter 331 which is preferably less than a minimum feature size for a process, generally a lithographic process, used to manufacture the access circuitry (not shown).

The bottom electrodes 500 having a sublithographic diameter 331 and the dielectric layer 310 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode", which is incorporated by reference herein. For example, a layer of electrode material can be formed on the top surface of access circuitry (not shown), followed by patterning of a layer of photoresist on the electrode layer using standard photo lithographic techniques so as to form a mask of photoresist overlying the locations of the bottom electrode 500. Next the mask of photoresist is trimmed, using for example oxygen plasma, to form mask structures having sublithographic dimensions overlying the locations of the bottom electrodes 500. Then the layer of electrode material is etched using the trimmed mask of photoresist, thereby forming the bottom electrodes 500 having sublithographic diameters 331. Next dielectric material 310 is formed and planarized, resulting in the structure illustrated in FIG. 5.

As another example, the bottom electrode 500 and dielectric layer 310 can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing", which is incorporated by reference herein. For example, the dielectric layer 310 can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the locations of the bottom electrode 500. The isolation layer and the sacrificial layers are then selectively etched using the mask, thereby forming vias in the isolation and sacrificial layers and exposing a top surface of the dielectric layer 310. After removal of the mask, a selective undercutting etch is performed on the vias such that the isolation layer is etched while leaving the sacrificial layer and the dielectric layer 310 intact. A fill material is then formed in the vias, which due to the selective undercutting etch process results in a self-aligned void in the fill material being formed within each via. Next, an anisotropic etching process is performed on the fill material to open the voids, and etching continues until the dielectric layer 310 is exposed in the region below the void, thereby forming a sidewall spacer comprising fill material within each via. The sidewall spacers have an opening dimension substantially determined by the dimensions of the void, and thus can be less than the minimum feature size of a lithographic process. Next, the dielectric layer 310 is etched using the sidewall spacers as an etch mask, thereby forming openings in the dielectric layer 310 having a diameter less than the minimum feature size. Next, an electrode layer is formed within the openings in the dielectric layer 144. A planarizing process, such as chemical mechanical polishing CMP, is then performed to remove the isolation layer and the sacrificial layer and to form the bottom electrode 500, resulting in the structure illustrated in FIG. 5.

Figure 6:
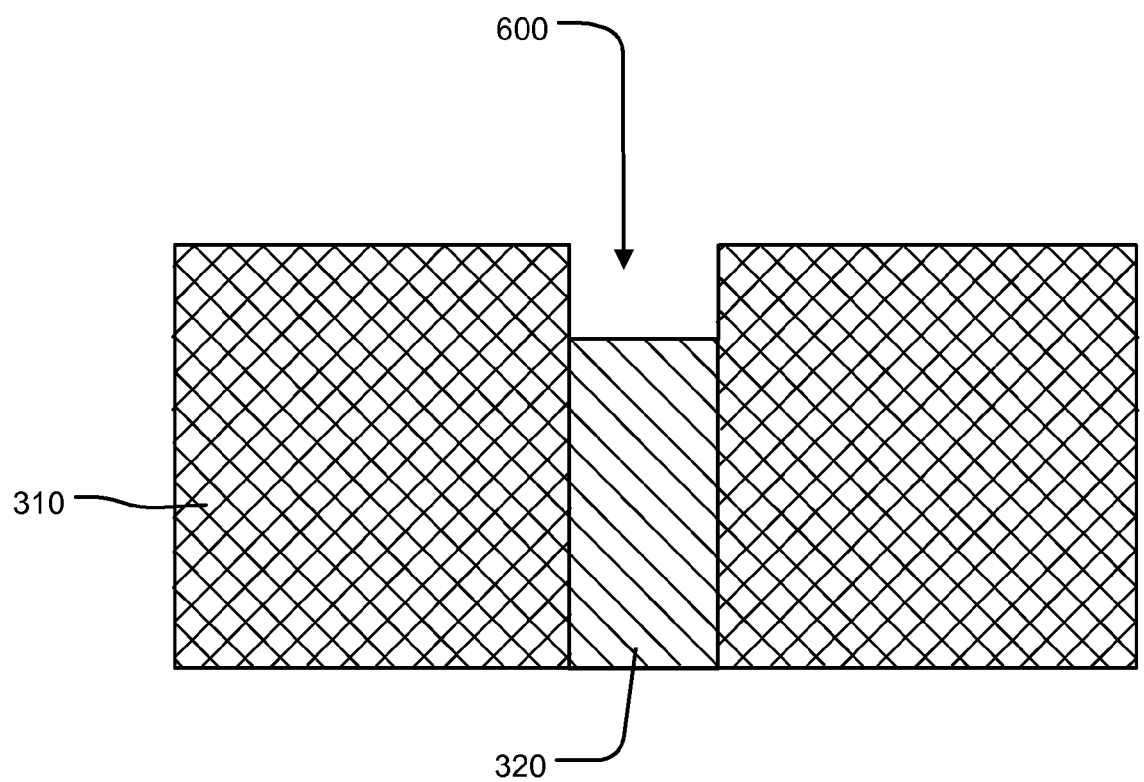

Next, a portion of the bottom electrode 500 is etched from the structure illustrated in FIG. 5, resulting in the structure illustrated in FIG. 6 having a recess 600 above a bottom electrode 320.

Figure 7:
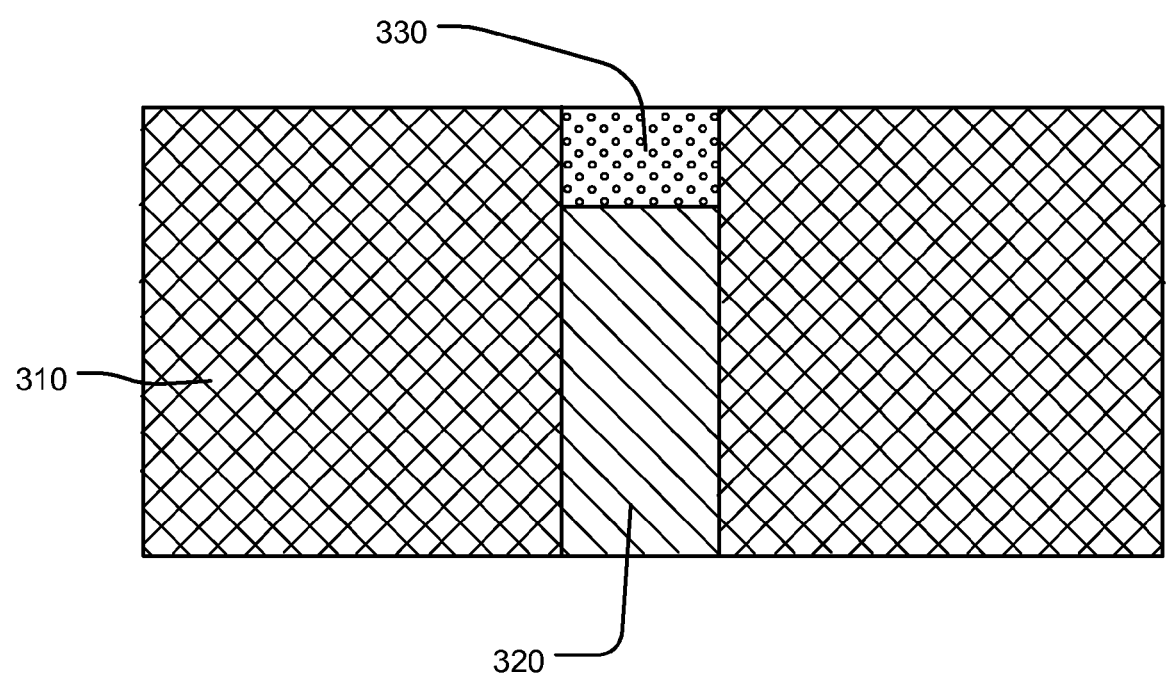

Next, a phase change layer comprising a first phase change material is formed in the recess 600 in FIG. 6 and planarized, resulting in the structure illustrated in FIG. 7 having a first phase change layer 330 on the bottom electrode 320.

Figure 8:
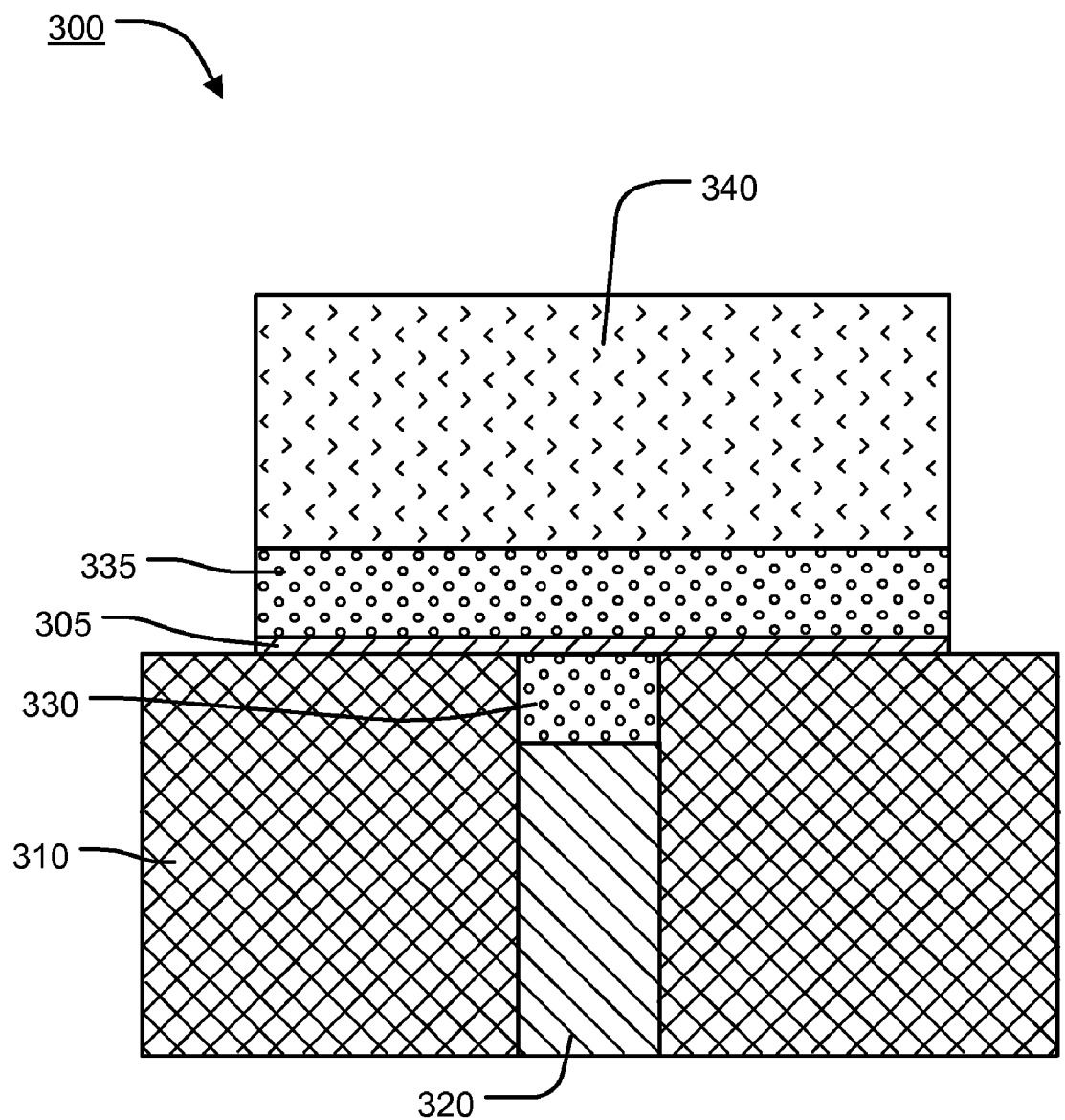
Figure 9:
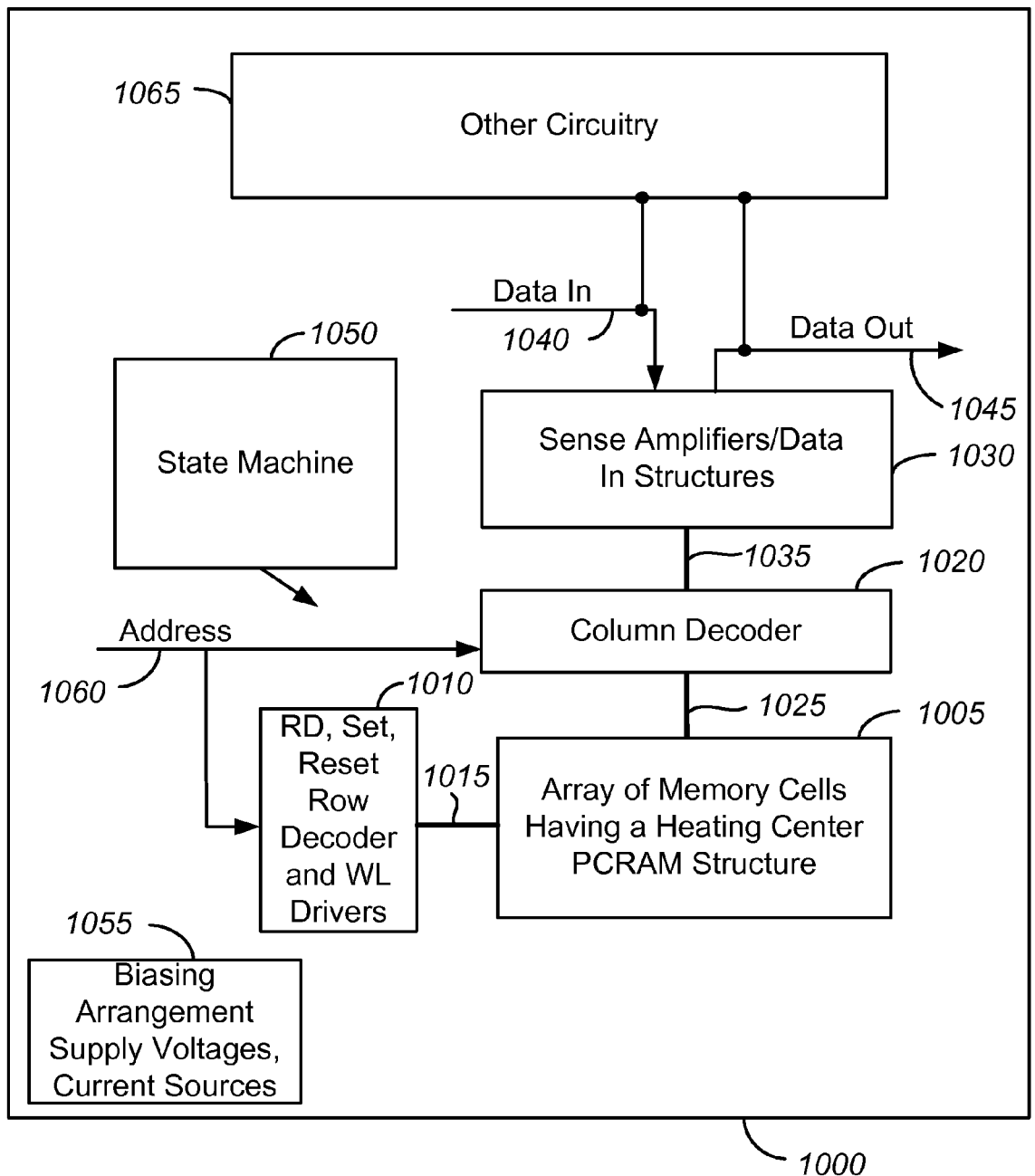
FIG. 9 is a simplified block diagram of an integrated circuit in accordance with an embodiment.

Next a multi-layer structure is formed on the structure illustrated in FIG. 8 comprising sequentially forming a layer of resistive heater material, a layer of second phase change material, and a layer top electrode material and patterning to form the memory cell 300 illustrated in FIG. 9 having a resistive heater 305 comprising resistive heater material, a second phase change layer 335 comprising second phase change material, and a top electrode 340 comprising top electrode material.

FIG. 9 is a simplified block diagram of an integrated circuit in accordance with an embodiment. The integrated circuit 1000 includes a memory array 1005 implemented using memory cells as described herein having a heating center PCRAM structure. A row decoder 1010 having read, set and reset modes is coupled to a plurality of word lines 1015 arranged along rows in the memory array 1005. A column decoder 1020 is coupled to a plurality of bit lines 1025 arranged along columns in the memory array 1005 for reading, setting and resetting memory cells in the memory array 1005. Addresses are supplied on bus 1060 to column decoder 1020 and row decoder 1010. Sense amplifiers and data-in structures in block 1030, including current sources for the read, set and reset modes, are coupled to the column decoder 1020 via data bus 1035. Data is supplied via the data-in line 1040 from input/output ports on the integrated circuit 1000 or from other data sources internal or external to the integrated circuit 1000, to the data-in structures in block 1030. In the illustrated embodiment, other circuitry 1065 is included on the integrated circuit 1000, such as a general purpose processor or special purpose application circuitry, or a combination of modules providing system-on-a-chip functionality supported by the phase change memory cell array. Data is supplied via the data-out line 1045 from the sense amplifiers in block 1030 to input/output ports on the integrated circuit 1000, or to other data destinations internal or external to the integrated circuit 1000.

A controller implemented in this example using bias arrangement state machine 1050 controls the application of bias arrangement supply voltages and current sources 1055, such as read, set, reset and verify voltages and or currents for the word lines and bit lines, and controls the word line/source line operation using an access control process. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 10:
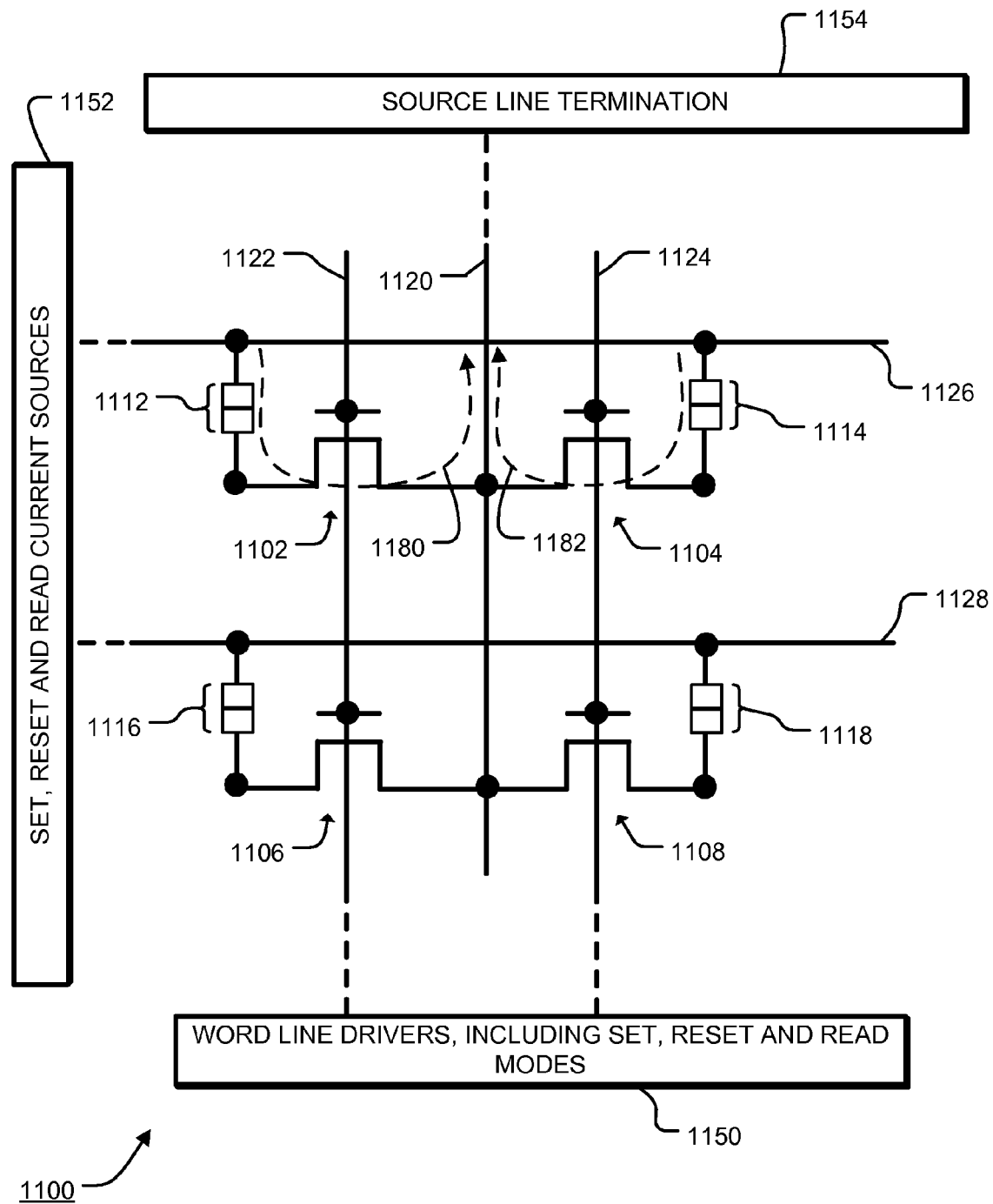
FIG. 10 is schematic illustration of a memory array implemented using memory cells as described herein.

FIG. 10 is a schematic illustration of a memory array 1100, which can be implemented using memory cells as described herein. Four memory cells 1102, 1104, 1106, and 1108 having respective memory elements 1112, 1114, 1116, and 1118 each having respective first and second phase change layers with a resistive heater therebetween are illustrated in FIG. 11, representing a small section of an array that can include millions of memory cells.

In the schematic illustration of FIG. 10, common source line 1120 and word lines 1122, 1124 are arranged generally parallel in the y-direction. Bit lines 1126, 1128 are arranged generally parallel in the x-direction. Thus, a y-decoder and a word line driver 1150, having set, reset, and read modes, are coupled to the word lines 1122, 1124. Bit line current sources 1152 for set, reset, and read modes, a decoder and sense amplifiers (not shown) are coupled to the bit lines 1126, 1128. The common source line 1120 is coupled to the source line termination circuit 1154, such as a ground terminal. The source line termination circuit 1154 may include bias circuits such as voltage sources and current sources, and decoding circuits for applying bias arrangements, other than ground, to the source lines in some embodiments.

The common source line 1120 is coupled to the source terminals of memory cells 1102, 1104, 1106, and 1108. The word line 1122 is coupled to the gate terminals of memory cells 1102, 1106. The word line 1124 is coupled to the gate terminals of memory cells 1104, 1108.

Memory cells 1102, 1104 including respective memory elements 1112, 1114 are representative. The memory element 1112 couples the drain of memory cell 1102 to bit line 1126. Likewise, memory element 1114 couples the drain of memory cell 1104 to bit line 1126. In operation, current sources 1152 operate in a lower current read mode, one or more intermediate current set modes, and a higher current reset mode. During the higher current reset mode, a current path 1180 through the selected memory cell (e.g. memory cell 1102 including memory element 1112) is established by applying a voltage and current to the bit line 1126, and voltages on the word line 1122 and source line 1120 sufficient to turn on the access transistor to memory cell 1102, so that the current flows through the source line 1120.

Likewise, during the lower current read mode, a current path 1182 through the selected memory cell (see the memory cell 1104 including memory element 1114) is established by applying a voltage and current to the bit line 1126, and voltages on the word line 1124 and source line 1120 sufficient to turn on the access transistor of memory cell 1104 and provide for current flow to the source line 1120.

During set mode, used for one or more intermediate current levels, an access transistor is enabled, as just described with respect to the read mode.

Advantages described herein include memory cells having reduced cell sizes, as well as a structure that addresses the heat conductivity problem, providing an array architecture supporting high-density devices, and a method for manufacturing such structure that meets tight process variation specifications needed for large-scale memory devices.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

Any and all patents, patent applications and printed publications referred to above are incorporated by reference.

What is claimed is:

1. A memory device comprising:
    a dielectric layer having a top surface;
    a via extending from the top surface of the dielectric layer and having a bottom portion and a top portion;
    a bottom electrode within the bottom portion of the via;
    a first phase change layer comprising a first phase change material within the top portion of the via and contacting the bottom electrode, the first phase change layer having a first contact area on a top surface having a first width;
    a resistive heater layer comprising a heater material having a bottom side in contact with the contact surface on the first phase change layer and having a second contact area on a top side, the second contact area having a second width greater than the first width, and wherein the resistive heater layer has a thickness less than or equal to 10 nm;
    a second phase change layer comprising a second phase change material, the second phase change layer having a bottom side in contact with the second contact area on the top side of the resistive heater layer; and
    a top electrode on the second phase change layer;
    wherein the heater material has a resistivity greater than the most highly resistive states of the first and second phase change materials.

2. The device of claim 1, wherein the first width is less than a minimum feature size for a lithographic process used to form the memory device.

3. The device of claim 2, wherein the resistive heater layer, second phase change layer, and top electrode form a multi-layer stack having said second width overlying the top surface of the dielectric layer.

4. The device of claim 1, wherein the heater material has a resistivity between about 1.5 and 100 times greater than the most highly resistive states of the first and second phase change materials.

5. The device of claim 4, wherein the heater material has a resistivity between about 4 and 50 times greater than the most highly resistive states of the first and second phase change materials.

6. The device of claim 1, wherein the heater material comprises one of TiN, TaN, TiW, TiSiN, or TaSiN doped with carbon.

7. The device of claim 1, wherein the first and second phase change materials comprise the same phase change material.

8. The device of claim 1, wherein the first and second phase change materials comprise different phase change material.

9. The device of claim 1, wherein each of the first and second phase change materials comprise a combination of two or more materials from the group of Ge, Sb, Te, Se, In, Ti, Ga, Bi, Sn, Cu, Pd, Pb, Ag, S, Si, O, P, As, N and Au.

10. A method for manufacturing a memory device, the method comprising:
    providing a bottom electrode extending to a top surface of a dielectric layer;
    removing a portion of the bottom electrode to form a recess;
    filling the recess with a first phase change material layer to form a phase change element having a first contact area on a top side, the first contact surface having a first width;
    forming a layer of heater material having a bottom side in contact with the first contact area on the first phase change layer and having a second contact area on a top side, the second contact area having a second width greater than the first width, wherein the layer of heater material has a thickness less than or equal to 10 nm;
    forming a second phase change material layer having a bottom side in contact with the second contact area across said second width on the top side of the layer of heater material; and
    forming a top electrode material layer on the second phase change layer;

wherein the heater material has a resistivity greater than the most highly resistive state of the first and second phase change materials.

11. The method of claim 10, wherein the filling the recess step comprises:

forming the first phase change material layer in the recess and on the top surface of the dielectric layer; and planarizing the first phase change material layer to expose the top surface of the dielectric layer.

12. The method of claim 11, further comprising etching the layer of heater material, the second phase change material layer, and the top electrode material layer, thereby forming a multi-layer stack having said second width overlying the top surface of the dielectric layer.

13. The method of claim 10, wherein the first width is less than a minimum feature size for a lithographic process used to form the memory device.

14. The method of claim 10, wherein the heater material has a resistivity between about 1.5 and 100 times greater than the most highly resistive states of the first and second phase change materials.

15. The method of claim 10, wherein the heater material comprises one of TiN, TaN, TiW, TiSiN, or TaSiN doped with carbon.

16. The method of claim 10, wherein the first and second phase change materials comprise the same phase change material.

17. The method of claim 10, wherein the first and second phase change materials comprise different phase change material.

18. The method of claim 10, wherein each of the first and second phase change materials comprise a combination of two or more materials from the group of Ge, Sb, Te, Se, In, Ti, Ga, Bi, Sn, Cu, Pd, Pb, Ag, S, Si, O, P, As, N and Au.

* * * * *